US005542602A

United States Patent [19]
Gaynes et al.

[11] Patent Number: 5,542,602
[45] Date of Patent: Aug. 6, 1996

[54] STABILIZATION OF CONDUCTIVE ADHESIVE BY METALLURGICAL BONDING

[75] Inventors: Michael A. Gaynes, Vestal; Kostas Papathomas; Giana M. Phelan, both of Endicott; Charles G. Woychik, Vestal, all of N.Y.

[73] Assignee: International Business Machines Corporation, Amonk, N.Y.

[21] Appl. No.: 366,582

[22] Filed: Dec. 30, 1994

[51] Int. Cl.⁶ .................................................. B23K 20/00
[52] U.S. Cl. .................... 228/175; 228/180.22; 228/194; 228/195
[58] Field of Search .............................. 228/175, 180.22, 228/194, 195, 198

[56] References Cited

U.S. PATENT DOCUMENTS

| | | | |
|---|---|---|---|
| 3,523,358 | 8/1970 | Zimmer et al. | 228/194 |
| 4,780,371 | 10/1988 | Joseph et al. | |
| 4,811,081 | 3/1989 | Lyden . | |
| 4,859,268 | 8/1989 | Joseph et al. | |
| 4,902,857 | 2/1990 | Cranston et al. | 228/175 |
| 5,093,986 | 3/1992 | Mandai et al. | 228/180.22 |
| 5,136,365 | 8/1992 | Pennisi et al. | |
| 5,269,453 | 12/1993 | Melton et al. | 228/195 |
| 5,346,857 | 9/1994 | Scharr et al. | 228/180.22 |

OTHER PUBLICATIONS

Bernstein "Semiconductor Joining by the Solid-Liquid-Interdiffusion (SLID) Process" *Journal of the Electrochemical Society* vol. 113, No. 12 pp. 1282–1288 Dec., 1966.

IBM Technical Disclosure Bulletin vol. 32 No. 4A pp. 273–274 Sep. 1989.

*Primary Examiner*—Kenneth J. Ramsey
*Attorney, Agent, or Firm*—Whitham, Curtis, Whitham & McGinn; Michael E. Belk

[57] ABSTRACT

A metallurgical bond which may be substituted for a soldering process forms an alloy of a metal with a metal coating applied to at least one of the surfaces to be so bonded by a transient liquid phase (TLP) reaction at a low temperature. Mechanically robust bonding of noble metals for electrical connections which are resistively stable through repeated thermal cycling can be performed at particularly low temperatures using coating materials of indium, tin or lead. Isotropically or anisotropically conductive connections can be formed by applying a polymer adhesive containing conductive particles to at least one of the surfaces to be bonded and a compressional force developed between surface by curing of the polymer adhesive at temperatures lower than the melting point of a eutectic alloy of the chosen metal system before the TLP process is allowed to proceed.

9 Claims, 7 Drawing Sheets

Time = $t_1$

Time = $t_2$ $t_3 \gg t_2$ (10 min)
at the temperature of the TLP reaction

STABILIZATION OF CONDUCTIVE ADHESIVE BY METALLURGICAL BONDING

BACKGROUND OF THE INVENTION

1. Field of the Invention

The present invention generally relates to the formation of electrically conductive mechanical bonds at low temperatures and, more particularly, to the electrical and mechanical stabilization of conductive adhesives used in the formation of such bonds.

2. Description of the Prior Art

For many years, solder has been the principal material of choice for forming bonds between metal or other conductive materials. Many techniques and materials such as fluxes having very selective surface wetting properties have been developed to extend solder connections into integrated circuit and multi-chip module technologies where only very small separations are provided between conductors which must remain electrically isolated while solder joints are formed on the surfaces thereof.

Most materials used for the solder connections themselves are mixtures or alloys of tin and lead. These materials have melting points in the range of 220° C. or higher. While this temperature range is relatively low and easily achieved in a great variety of ways, there are a number of materials and devices which can be damaged by such temperatures. With regard to some applications, heat sinking with local application of heat may provide a solution to the successful formation of a solder bond. However, the use of a heat sink generally implies the potential for application of a greater amount of heat than is tolerable since the performance of the thermal connection to the heat sink is somewhat unpredictable.

Therefore, for close control of temperature, general heating in a furnace or oven of the device with a material for forming the bond in place is the technique of choice. Of course, with general heating, there is no possibility of protection of any temperature sensitive material which may be present and damaged by the maximum temperature attained. If the temperature at which a material may be damaged is lower than the melting point of the solder material, as is the case with recently developed low dielectric constant materials, a solder bond is simply not appropriate and cannot be formed without loss of the properties for which the low dielectric constant material may have been chosen.

Conductive adhesives are known for forming electrically conductive mechanical connections. Such conductive adhesives generally involve a high concentration of conductive plastics in a thermosetting or thermoplastic binder. Conduction, in any case, depends on compressive force between the particles to maintain an intimate surface contact therebetween. Such a compressive force is generally obtained through volume shrinkage as thermosetting binder cures or through joining reflow with thermoplastic binders.

In either case, however, the binder matrix is subject to a tendency to creep during thermal cycling. As a result, the compressional force may be lost and the mechanical contact between some particles may be broken; causing a resistance drift over time or at least instability of resistance of a connection. In severe cases, complete loss of electrical integrity of some connections results, often unpredictably and after a particular device or circuit has been placed in service.

In summary, connections made with conductive adhesives have been generally unreliable due to the tendency for compressive force between the conductive particles to be slowly lost or severely compromised over time due to even moderate thermal cycling. Since contact between the particles is generally over a very small area because the particles are generally spherical, loss of reliable compressive force between even a relatively small fraction of the particles can cause substantial fluctuations in resistance of the connection, especially during thermal excursions. Therefore, instability of resistance can significantly change circuit performance even long before continuity is lost.

SUMMARY OF THE INVENTION

It is therefore an object of the present invention to provide a reliable metallic bond within the bulk of a conductive adhesive at low temperatures.

It is another object of the present invention to provide a conductive adhesive in which a stable metallic bond can be formed between particles therein at temperatures below those at which solder joints can be formed.

It is a further object of the invention to provide a mechanism for forming and isotropic or anisotropic connection within the bulk of a conductive adhesive which increases in stability rather than degrades in stability over time during which thermal cycling can occur.

In order to accomplish these and other objects of the invention, a method is provided for forming a metallurgical bond between two metal surfaces including the steps of placing a metal coating on at least one of the surfaces, applying a compressional force to the metal surfaces against each other, and alloying the metal coating with both of the two metal surfaces at a temperature at or below 237° C.

In accordance with another aspect of the invention, a device is provided including a metallurgical bond between two bodies of noble metal including a region extending into said two bodies of noble metal comprising an alloy of noble metal and a metal selected from the group consisting of indium, tin and lead.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
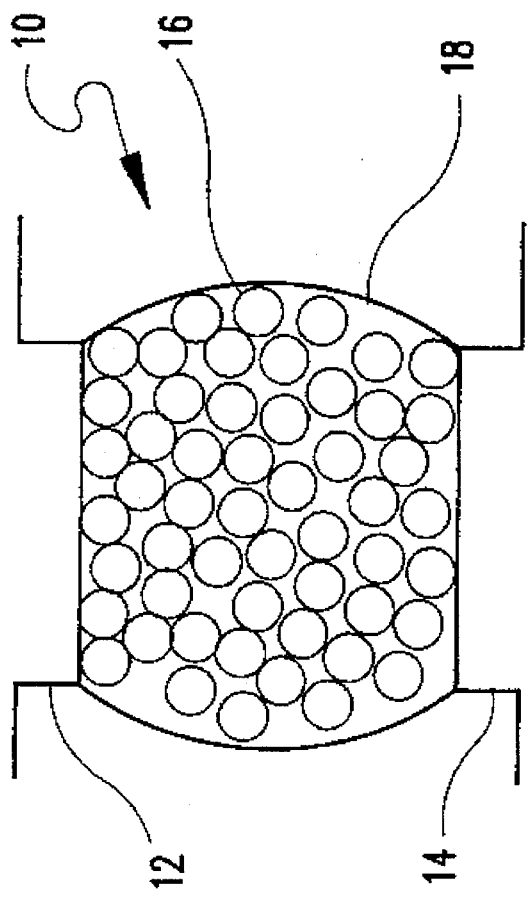
FIG. 1 is a cross-sectional representation of an isotropically conductive connection made between two raised pads.

Referring now to the drawings, and more particularly to FIG. 1, there is shown a cross-sectional view of an isotropically conductive connection 10. FIG. 1 is labelled "Related Art" since it depicts geometries which may be representative of systems other than the invention as well as the invention, itself. Therefore, it is to be understood that no part of FIG. 1 is admitted to be prior art as to the present invention.

To form this isotropically conductive connection between two raised connection pads 12, 14, generally spherical conductive particles 16 are mixed to a high concentration, preferably a volume fraction above the percolation threshold, in a polymer thermosetting or thermoplastic adhesive and coated on one or both raised pads. The facing surfaces are juxtaposed in registration and pressed together. The connection is then treated at an elevated temperature for a sufficient time to cure the polymer adhesive to form a matrix 18 in which the conductive particles are pressed into contact with each other. This compressive force derives from volume reduction of thermosetting adhesive or joining reflow of thermoplastic material during the curing process.

However, both adhesive matrix materials tend to exhibit creep over time and with thermal cycling and the compressive force between conductive particles is slowly lost, compromising conductivity of the connection. Therefore, to avoid the effect of loss of conductivity as compressive force may be reduced, the invention provides for formation of a metallurgical bond between the particles immediately following the curing of the adhesive material when compressive forces are at a maximum.

The invention exploits a so-called transient liquid phase (TLP) reaction for alloying on metals. Basically, when two metals are brought into compressive contact and heated, a low melting point eutectic alloy forms having concentrations or proportions of each of the two metals characteristic of that alloy in a liquified zone around the location where the metals are brought into contact. This zone expands as the metals mix as long as heat is applied and adequate amounts of each metal are available. The heating may be interrupted and resumed to continue the process at any time. If the mass of one of the metals is limited, the process will also be limited since the melting point of the alloy will rise as the relative concentration of one metal decreases while the concentration of the other metal increases. At the limit of the process, the melting point of the resulting alloy will approach that of the predominant metal.

Figure 2:
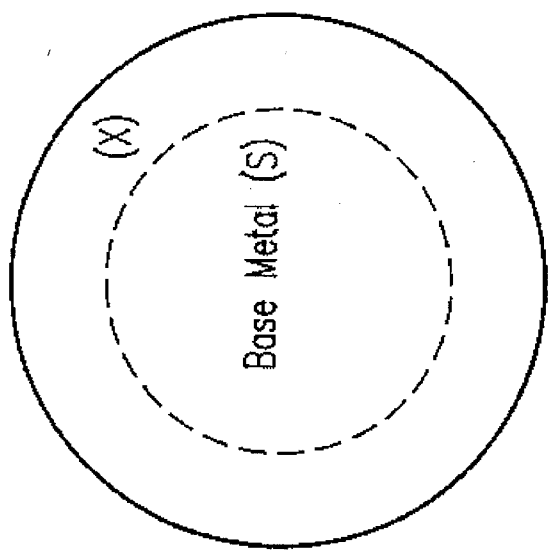
FIG. 2 is a cross-sectional view of one form of conductive particle in accordance with the invention.

To exploit this reaction to create an isotropically conductive connection, conductive particles are preferably formed in accordance with FIG. 2. Specifically, a particle having a preferred size of about 10–15 microns of a supporting or base metal (denoted by "S") are formed and coated with another metal (denoted "X") suitable for formation of the intended alloy to a thickness of about 1.0–1.5 microns by known processes. While the TLP process can, in theory, be carried out with any combination of metals, the choice of metals suitable for forming a highly conductive connection at temperatures not significantly exceeding 220° C. is relatively limited.

Since it is known that silver has the highest specific electrical conductivity followed by copper and gold, one of these metals should be chosen as the base material S of the conductive particles. These metals are known as noble metals because of their outer electronic structure and behave similarly when alloyed with indium or tin. (It should be noted that the term "base metal" as may be used herein is used in the sense of "principal", "supporting" or "substrate" metal and should not be confused with or considered to be contradictory to the "noble metal" nomenclature.) The alloying material should be chosen based upon the melting point of eutectic alloys that can be formed therewith. Phase diagrams for many combinations of metals are available in the literature and appropriate choices can be readily made therefrom. Exemplary phase diagrams corresponding to metal systems which are preferred for the practice of the invention are shown in FIGS. 3–9.

Figures 3, 4:
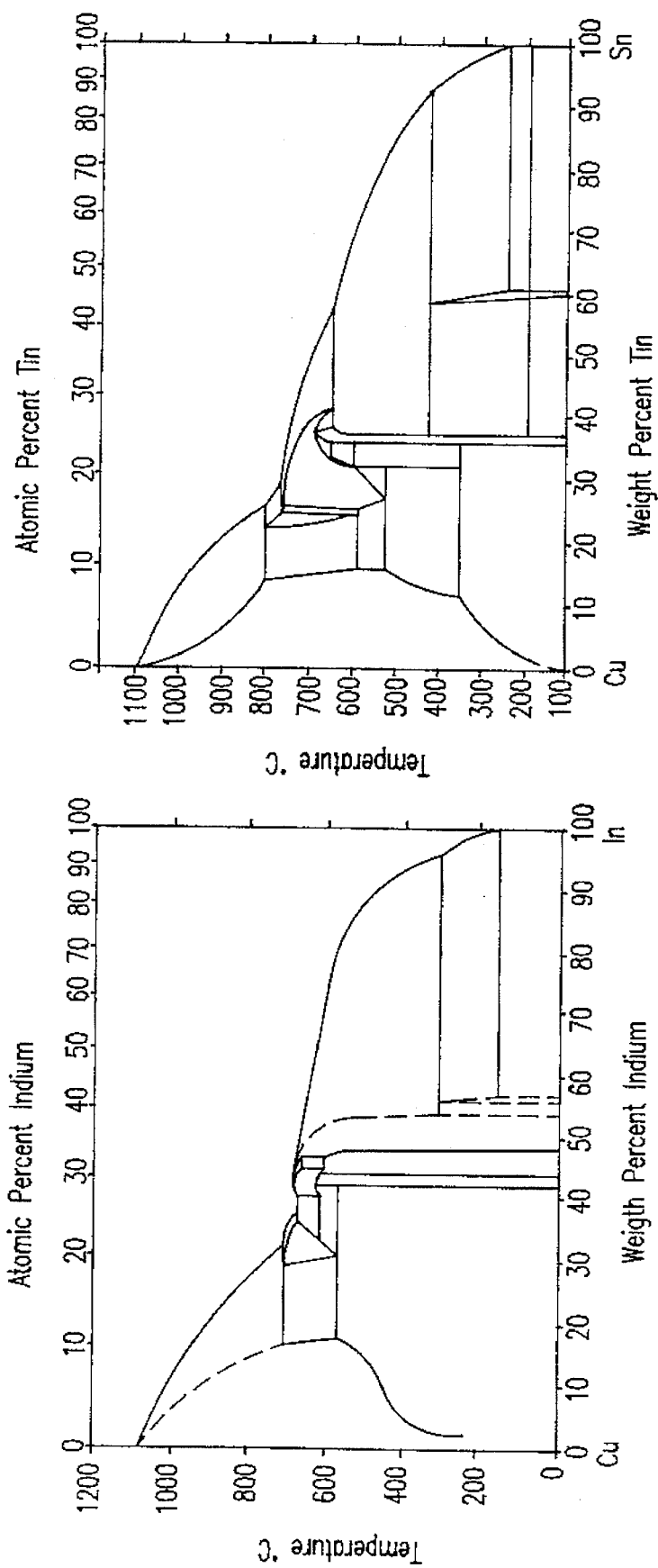
FIGS. 3, 4, 5, 6, 7, 8 and 9 are phase diagrams of metal alloy systems useful in accordance with the invention.
Figure 6:
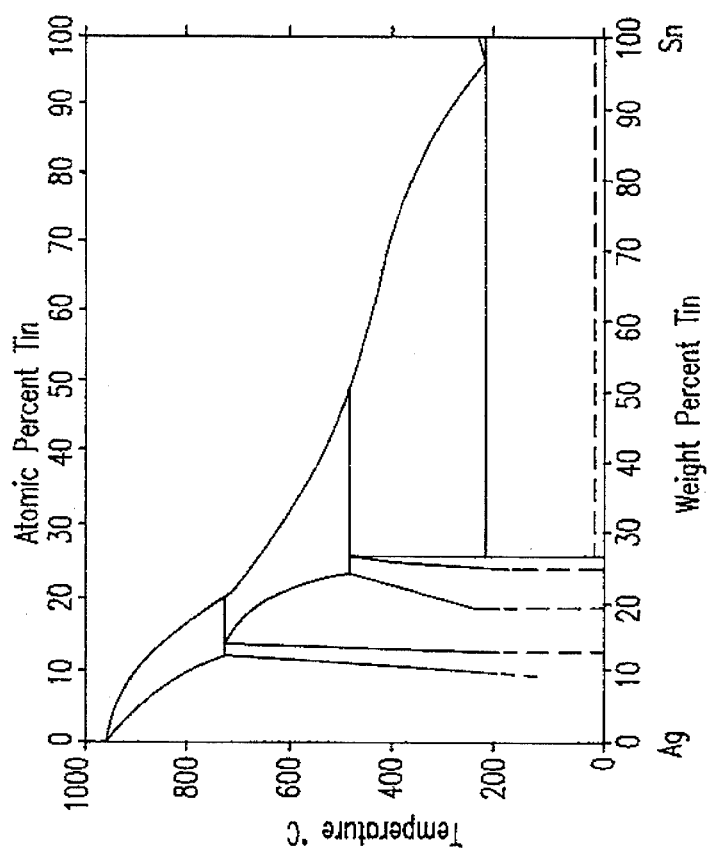
Figure 5:
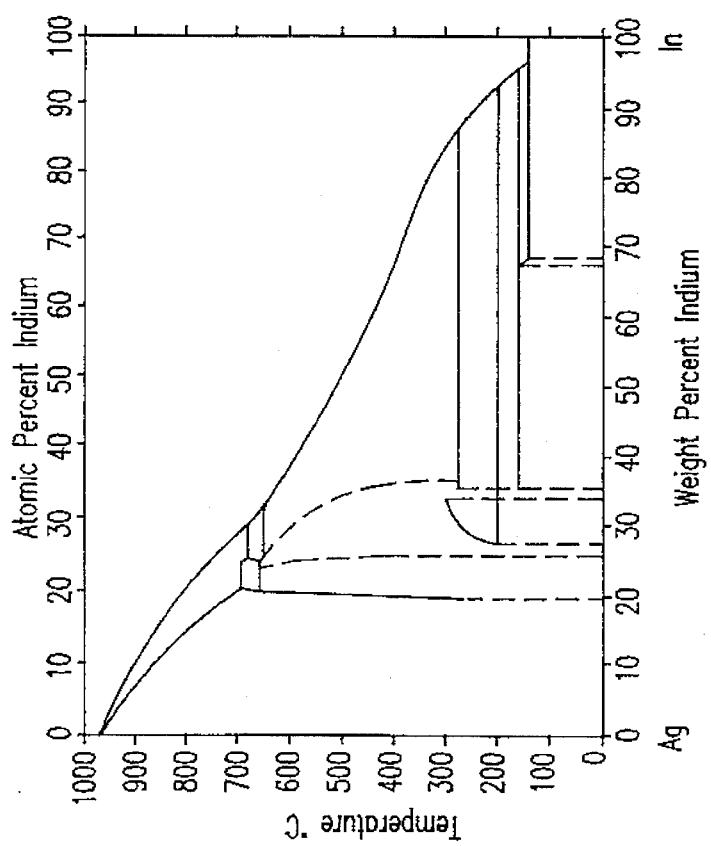
Figure 8:
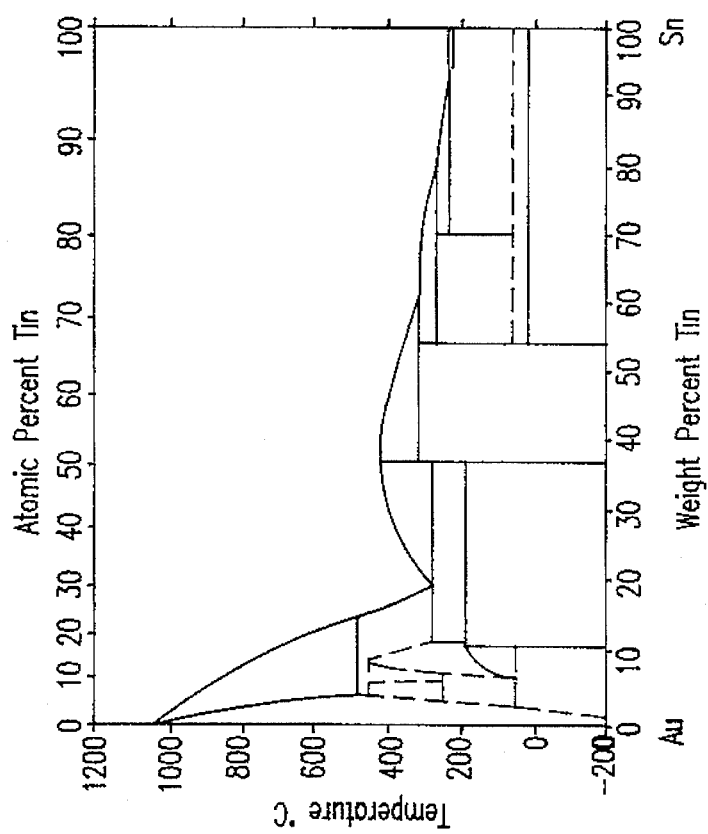
Figure 7:
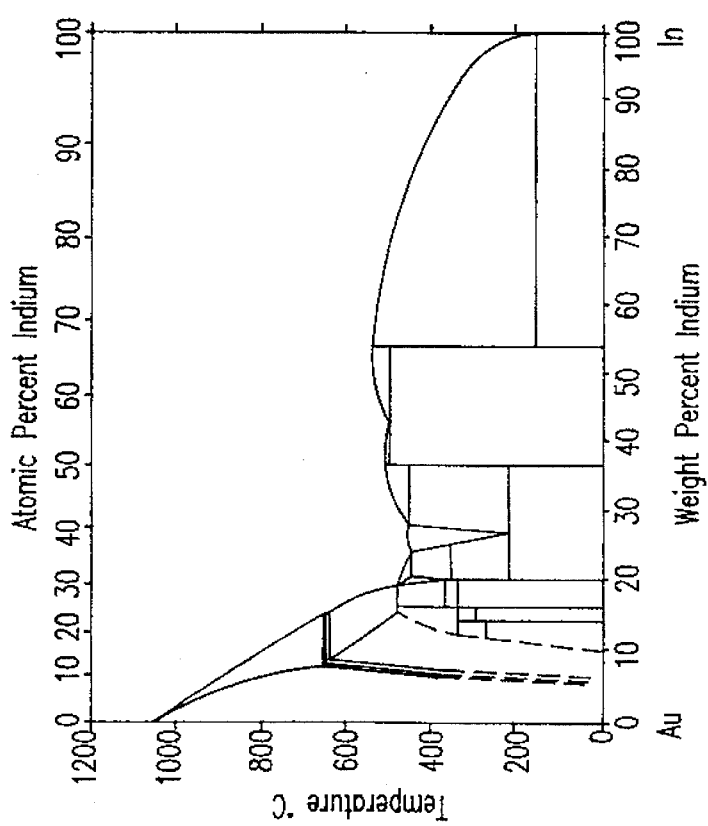
Figure 9:
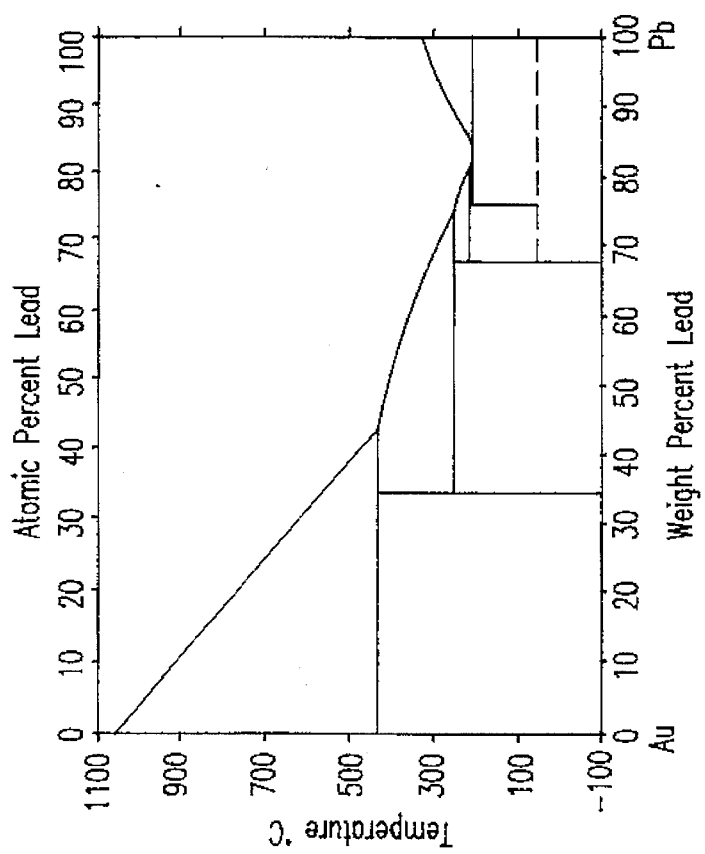

Specifically, FIG. 3 is a phase diagram for a copper-indium system which exhibits a eutectic alloy melting point of 153° C. FIG. 4 is a phase diagram for a copper-tin system which exhibits a eutectic alloy melting point of 227° C. FIGS. 5 and 6 are phase diagrams for a silver-indium system and a silver-tin system which exhibit eutectic alloy melting points of 141° C. and 221° C., respectively. FIGS. 7 and 8 are phase diagrams for a gold-indium system and a gold-tin system which exhibit eutectic alloy melting points of 156° C. and 217° C., respectively. In addition, FIG. 9 is a phase diagram for a gold-lead system which exhibits a eutectic alloy melting point of 212.5° C.

From an electrical conductivity standpoint, all of these systems are desirable. The systems containing indium (S-In) all have eutectic alloy melting points near 150° C. The systems containing tin (S-Sn) and the gold-lead system have eutectic alloy melting points in the vicinity of 220° C. A TLP reaction can be carried out in a relatively short time (about ten minutes) at temperatures in the range of 5° C.–15° C. above the respective eutectic alloy melting points and thus are all suitable for producing metallurgical bonds at temperatures below those which will damage recently developed low dielectric constant materials.

Further, since curing develops the compressive force which causes the TLP reaction to proceed most reliably, it is desirable that curing of the polymer adhesive be carried out at temperature below those which will initiate the TLP reaction and before the TLP reaction is allowed to occur. Fortuitously, known thermosetting type polymer adhesives can generally be cured at temperatures in the range of 100° C.–200° C. and in the case of known thermoplastic adhesives melting and joining reflow occur at temperatures in the range of 135° C.–300° C. Thus it is seen that an adequate range of curing temperatures exist for either type of material to be cured and to develop a compressive force between conductive particles in the resulting adhesive matrix prior to carrying out the TLP reaction using any of the metal systems discussed above at an increased temperature preferably about 10° C. above the eutectic alloy melting point for the particular metal system chosen, although the temperature differential may be limited due to the presence of other materials which may be damaged. That is, for a 10° C. temperature differential above the melting point of the eutectic alloy, a maximum temperature of 237° C. would be required for any of the metal systems discussed and lower temperatures would suffice for practice of the invention for other metal systems. Slightly lower temperatures could also be used if additional time is allowed for the alloying process to occur. It should also be noted that it is not necessary for the process to be fully completed during the manufacture of a device containing a metal bond in accordance with the invention and any later thermal cycling or heat treatment (such as annealing) which later occurs will tend to continue the process and strengthen the bond.

In the interest of completeness, the TLP reaction will now be discussed in detail for forming an isotropically conductive connection with reference to FIGS. 10A–13A (FIGS. 10B–13B show corresponding steps in the TLP process for forming an anisotropically conductive connection as will be described below.) Initially, FIG. 10A shows the contact point of two conductive particles in accordance with FIG. 2. It is assumed that the contact is made with a compressive force maintained by the cured adhesive matrix. As shown in FIG. 11A, as the temperature reaches and exceeds the melting point of the eutectic alloy corresponding to the metal system chosen, the coating metal X diffuses somewhat into the base metal S in region 112 and a liquid phase alloy is formed at the location of the original interface of the base metal and coating metal. As shown in FIG. 12A, at a later time during the maintaining of the appropriate temperature, the liquid phase expands as shown at 113 throughout the original coating region and regions of the base metal in which the concentration of the coating metal X is sufficient to form a eutectic alloy with the base material S. At a later time and at the limit of the reaction (or upon cooling) an S-rich (e.g. substrate-rich) alloy in solid phase is formed throughout region 114 since the melting point of the resulting alloy will rise as the mass of the base metal in the alloy begins predominate over the available mass of the coating metal (e.g. the coating material is depleted by the alloying). Thus a metallurgical bond is formed between the particles and the properties of the alloy will approach those of the base metal. For example, with further thermal cycling, the annealing temperature of the alloy rises to approach that of the base metal. The presence of the liquid phase also serves to relieve some of the compressive forces in the cured adhesive matrix and the portion of the connection strength attributable to the adhesive matrix will also be increased in accordance with the invention.

Figure 10C:
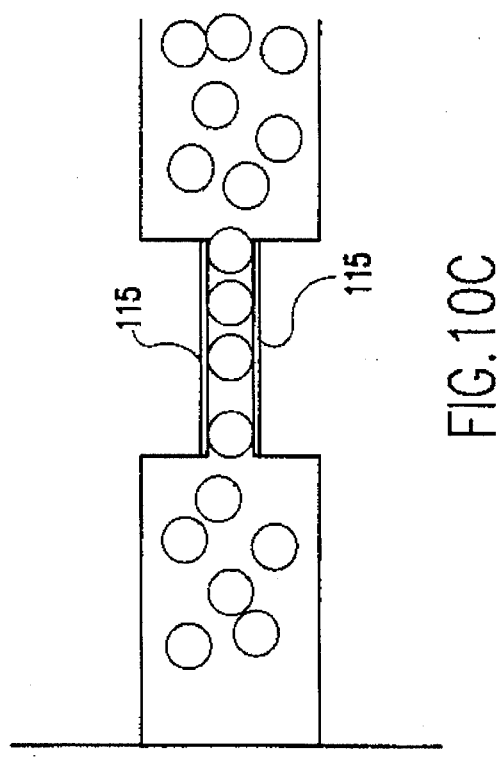
FIG. 10C shows a cross-sectional view of the geometry of an anisotropically conducting connection in accordance with the invention.

The TLP reaction can also be used to form an anisotropically conducting connection as illustrated in FIG. 10C which will also be illustrative of some variations of the invention applicable to the formation of isotropically conductive connections, as well. Specifically, FIG. 10C shows a connection between raised pads in which the pad surfaces are more closely proximate each other to the point of contacting a single layer of conductive particles. Conductive adhesive is allowed to extrude from between the raised pads and pressure is not applied thereto, The concentration of metal particles may be somewhat less than for forming isotropic connections to avoid contact therebetween in regions where pressure is not applied and it is preferred that the concentration of conductive particle be below the percolation threshold. It is also preferred for formation of an anisotropically conductive connection that no coating be applied to the conductive particles but only in a layer 115 on the raised pads so that no alloying will occur between the conductive particles.

Figure 10B:
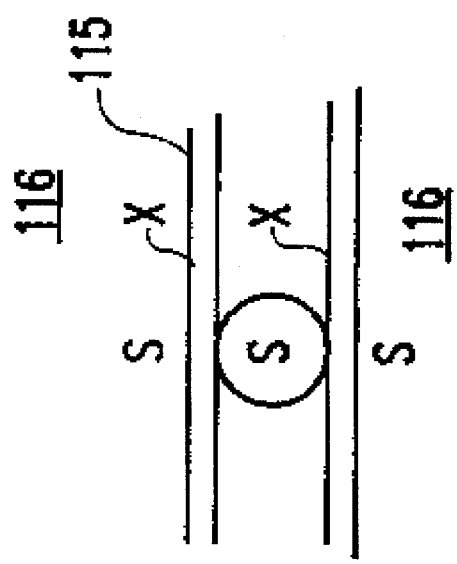
FIGS. 10B, 11B, 12B and 13B show cross-sectional views of formation of an anisotropically conductive connection in accordance with the invention.
Figure 10A:
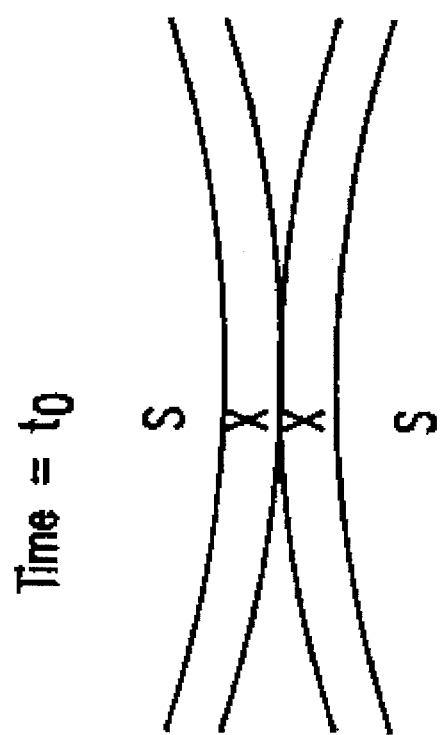
FIGS. 10A, 11A, 12A and 13A show cross-sectional views of formation of an isotropically conductive connection in accordance with the invention.
Figure 11A:
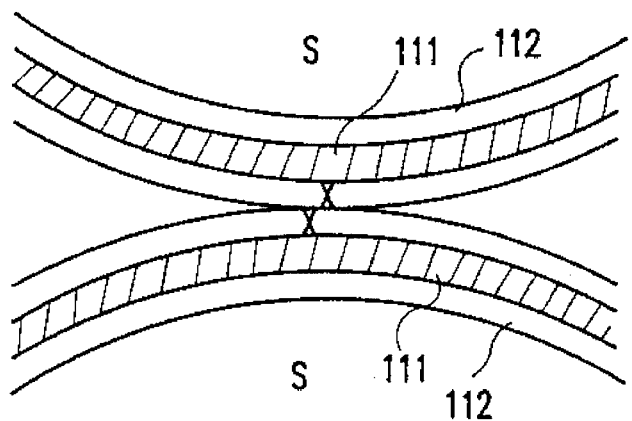
Figure 11B:
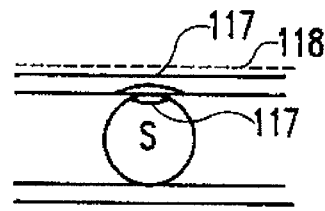
Figure 12A:
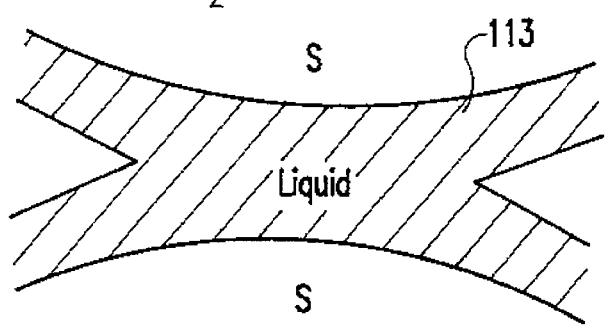
Figure 12B:
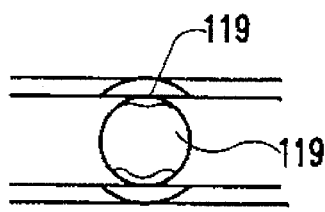
Figure 13A:
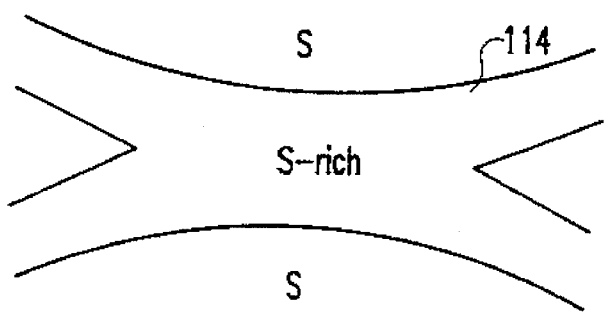
Figure 13B:
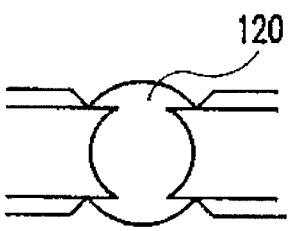

FIG. 10B shows an enlarged cross-sectional view of a single particle of noble metal, denoted S, between the two raised pads 116 of noble metal having a coating of alloying metal thereon. As in the isotropically conducting connection embodiment of the invention, as the temperature is raised and exceeds the melting point of the eutectic alloy of the chosen metal system, the coating metal diffuses into the base metal of both the pad and the conductive particle as shown at 118 and a liquid phase region forms at the interface of the particle and pad, as shown in FIG. 11B. As the TLP reaction continues, as shown in FIG. 12B, the liquid phase region expands throughout the coating region and somewhat into the substrate materials of both the particle and pad. As shown in FIG. 13B, at the completion of the process, a solid phase S-rich alloy region extends through the entire particle and into both of the raised pads. It should be noted that the coating material is depleted in the region immediately surrounding the S-rich alloy.

In view of the foregoing, it is clearly seen that the invention provides a conductive metallurgical bond of high mechanical strength and resistive stability during thermal cycling at temperatures below those appropriate to soldering processes and which may cause damage to other materials in the device or near the connection.

It should also be noted that the invention provides a system of forming a metallurgical bond as an alternative to soldering in which the use of lead, a potential environmental pollutant, can be entirely avoided. Further, it should be appreciated that the invention may be practiced using conductive particles of a size much smaller than can be used in solder-containing pastes and the invention, particularly the variation providing an anisotropically conducting connection, may thus be practiced on far smaller and closely spaced conductors than is possible with soldering techniques.

While the invention has been described in terms of a single preferred embodiment, those skilled in the art will recognize that the invention can be practiced with modification within the spirit and scope of the appended claims. For example, different noble metals could be bonded using the methodology of the invention at a temperature determined by the higher of the melting points of the two eutectic alloys of each of the two metal systems involved. It is also possible to use combinations of coating metals.

Having thus described my invention, what we claim as new and desire to secure by Letters Patent is as follows:

1. A method for forming a metallurgical bond between two metal surfaces including the steps of placing a metal coating on at least one of the surfaces, wherein one of said surfaces is a surface of a conductive particle, applying a compressional force to the metal surfaces against each other, wherein said compressional force is applied by a cured adhesive matrix containing at least one conductive particle, and alloying the metal coating with both of the two metal surfaces at a temperature at or below 237° C.

2. A method for forming a metallurgical bond between two metal surfaces including the steps of placing a metal coating on at least one of the surfaces, forming conductive particles, dispersing said particles in a polymer material, applying a compressional force to the metal surfaces against said particles, and alloying the conductive particles with the metal surfaces at a temperature at or below 237° C. by a transient liquid phase process.

3. A method as recited in claim 2, wherein a volume fraction of said conductive particles in said organic material is above a percolation threshold.

4. A method as recited in claim 2, wherein a volume fraction of said conductive particles in said organic material is below a percolation threshold.

5. A method as recited in claim 2, including the further step of placing a metal coating on at least one of the surfaces.

6. A method as recited in claim 2, wherein said polymer material is a polymer adhesive.

7. A method as recited in claim 2, including the further step of placing a metal coating said conductive particles.

8. A device including a transient liquid phase metallurgical bond between two bodies of noble metal and a metal particle in an adhesive matrix, one of said particle and said surfaces including a coating of at least one of indium, tin and lead, said metallurgical bond including a region extending into said two bodies of noble metal comprising an alloy of noble metal and said metal coating.

9. A method for forming a metallurgical bond between two metal surfaces including the steps of placing a metal coating on at least one of the surfaces, wherein one of said surfaces is a surface of a conductive particle and said metal coating is applied to at least said conductive particle, applying a compressional force to the metal surfaces against each other, alloying the metal coating with both of the two metal surfaces at a temperature at or below 237° C. by a transient liquid phase process.

* * * * *